United States Patent
Yang et al.

(10) Patent No.: US 10,482,821 B2
(45) Date of Patent: Nov. 19, 2019

(54) PIXEL AND DISPLAY DEVICE INCLUDING THE SAME

(71) Applicant: Samsung Display Co., Ltd., Yongin-si (KR)

(72) Inventors: Taehoon Yang, Yongin-si (KR); Jongchan Lee, Suwon-si (KR); Woonghee Jeong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/034,359

(22) Filed: Jul. 13, 2018

(65) Prior Publication Data
US 2019/0180688 A1 Jun. 13, 2019

(30) Foreign Application Priority Data
Dec. 7, 2017 (KR) .......................... 10-2017-0167818

(51) Int. Cl.
*G09G 5/10* (2006.01)
*G09G 3/3258* (2016.01)
*H01L 27/32* (2006.01)

(52) U.S. Cl.
CPC ....... *G09G 3/3258* (2013.01); *H01L 27/3262* (2013.01); *H01L 27/3265* (2013.01); *G09G 2320/0233* (2013.01)

(58) Field of Classification Search
CPC .......... G09G 3/3258; G09G 2320/0233; H01L 27/32; H01L 27/3262; H01L 27/3265
See application file for complete search history.

(56) References Cited

U.S. PATENT DOCUMENTS

| 8,405,583 B2 | 3/2013 | Ebisuno |
| 9,318,390 B2 | 4/2016 | Routh et al. |
| 2011/0115764 A1* | 5/2011 | Chung ................. G09G 3/3233 345/205 |

(Continued)

FOREIGN PATENT DOCUMENTS

KR    10-2016-0015509    2/2016

OTHER PUBLICATIONS

Park et al, "53.5: High-Speed AMOLED Pixel Circuit and Driving Scheme," SID Symposium Digest of Technical Papers of Technical Papers, Jul. 5, 2012, pp. 806-809, vol. 41, Issue 1, Wiley.

*Primary Examiner* — Joe H Cheng
(74) *Attorney, Agent, or Firm* — H.C. Park & Associates, PLC

(57) ABSTRACT

A pixel, wherein: gates of second and fifth transistors receive a first gate signal; gates of third and fourth transistors respectively receive second and third gate signals; first terminals (FTs) of the second to fifth transistors respectively receive a data voltage, reference voltage, initialization voltage, and first power supply voltage (PSV); a second electrode of a second capacitor receives the first PSV; a second terminal (ST) of a light emitting element (LEE) receives a second PSV; a gate of a first transistor, STs of the second and third transistors, and a first electrode of a first capacitor are connected to a first node; STs of the first and fourth transistors, a FT of the LEE, and second and first electrodes respectively of the first and second capacitors are connected to a second node; and a ST of the fifth transistor is connected to a FT of the first transistor.

21 Claims, 11 Drawing Sheets

(56) References Cited

U.S. PATENT DOCUMENTS

| | | | | |
|---|---|---|---|---|
| 2011/0193850 A1* | 8/2011 | Chung | ............... | G09G 3/3233 345/212 |
| 2012/0162275 A1* | 6/2012 | Park | ............... | H01L 27/3265 345/690 |
| 2013/0002632 A1* | 1/2013 | Choi | ............... | G09G 3/325 345/211 |
| 2013/0057532 A1* | 3/2013 | Lee | ............... | G09G 3/3225 345/211 |
| 2014/0167009 A1* | 6/2014 | Lee | ............... | H01L 27/3272 257/40 |
| 2014/0354522 A1* | 12/2014 | Chung | ............... | G09G 3/003 345/82 |
| 2015/0279269 A1* | 10/2015 | Ishii | ............... | G09G 3/3233 345/690 |
| 2016/0275869 A1* | 9/2016 | Hwang | ............... | G09G 3/3258 |
| 2017/0270867 A1* | 9/2017 | Zhu | ............... | G09G 3/3233 |
| 2017/0278457 A1* | 9/2017 | Zhu | ............... | G09G 3/3233 |
| 2018/0061922 A1* | 3/2018 | Kim | ............... | H01L 27/1251 |
| 2018/0315374 A1* | 11/2018 | Zhang | ............... | G09G 3/3208 |

\* cited by examiner

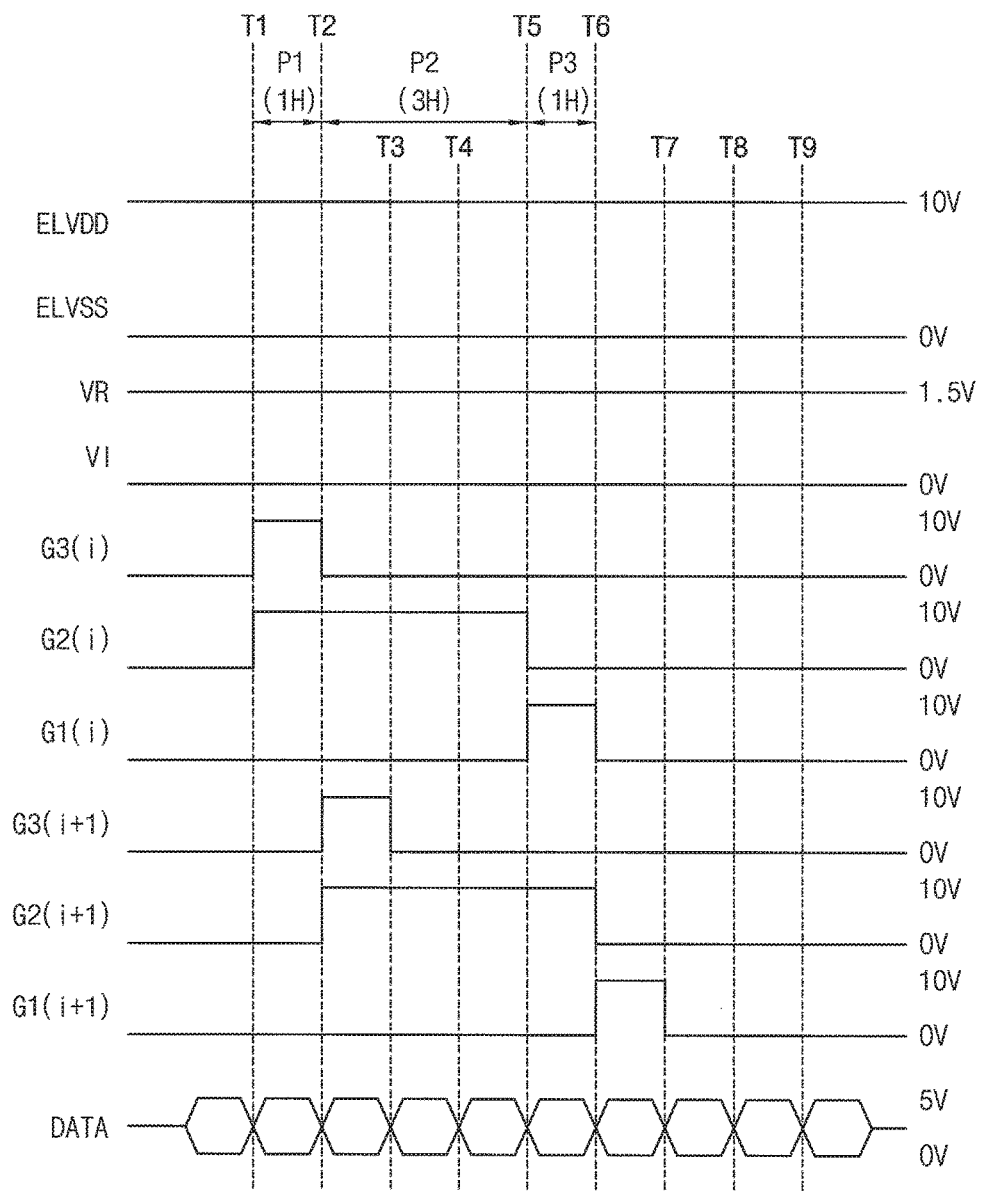

PIXEL AND DISPLAY DEVICE INCLUDING THE SAME

CROSS-REFERENCE TO RELATED APPLICATION

This application claims priority from and the benefit of Korean Patent Application No. 10-2017-0167818, filed Dec. 7, 2017, which is hereby incorporated by reference for all purposes as if fully set forth herein.

BACKGROUND

Field

Exemplary embodiments generally relate to display devices, and more particularly, to pixels capable of compensating threshold voltages of driving transistors and display devices including the pixels.

Discussion

Each pixel of an organic light emitting display device typically includes a light emitting element (e.g., an organic light emitting diode), a luminance of which varies according to a driving current. Each pixel may further include a driving transistor that controls an amount of the driving current supplied to the organic light emitting diode according to a data voltage, and a switching transistor that applies the data voltage to the driving transistor to control the luminance of the organic light emitting diode.

Driving transistors of the pixels may have different threshold voltages due to manufacturing idiosyncrasies and/or errors, and thus, even when the same data voltage is applied, the amount of driving current output from the driving transistors may be different according to the different threshold voltages, which results in luminance deviations among the pixels. To address this issue, various pixel circuits have been researched to compensate the threshold voltages of the driving transistors. For example, the pixel circuit may be driven in a frame period including an initialization period, a data writing and threshold voltage compensation period, and an emission period. As a resolution of the display device increases, the threshold voltage compensation period for compensating the threshold voltages of the driving transistors may be shortened, and thus, image quality may be degraded.

The above information disclosed in this section is only for understanding the background of the inventive concepts, and, therefore, may contain information that does not form prior art.

SUMMARY

Some exemplary embodiments provide a pixel capable of improving image quality.

Some exemplary embodiments provide a display device including a pixel capable of improving image quality.

Additional aspects will be set forth in the detailed description which follows, and, in part, will be apparent from the disclosure, or may be learned by practice of the inventive concepts.

According to some exemplary embodiments, a pixel includes first to fifth transistors, first and second capacitors, and a light emitting element. The first transistor includes a gate connected to a first node, a first terminal, and a second terminal connected to a second node. The second transistor includes a gate configured to receive a first gate signal, a first terminal configured to receive a data voltage, and a second terminal connected to the first node. The third transistor includes a gate configured to receive a second gate signal, a first terminal configured to receive a reference voltage, and a second terminal connected to the first node. The fourth transistor includes a gate configured to receive a third gate signal, a first terminal configured to receive an initialization voltage, and a second terminal connected to the second node. The fifth transistor includes a gate configured to receive the first gate signal, a first terminal configured to receive a first power supply voltage, and a second terminal connected to the first terminal of the first transistor. The first capacitor includes a first electrode connected to the first node, and a second electrode connected to the second node. The second capacitor includes a first electrode connected to the second node, and a second electrode configured to receive the first power supply voltage. The light emitting element includes a first terminal connected to the second node, and a second terminal configured to receive a second power supply voltage.

In some exemplary embodiments, the second transistor may be configured to turn on in response to a first logic level of the first gate signal, and the fifth transistor may be configured to turn on in response to a second logic level of the first gate signal, the second logic level being different from the first logic level.

In some exemplary embodiments, the second transistor may be an n-channel metal oxide semiconductor (MOS) transistor, and the fifth transistor may be a p-channel MOS transistor.

In some exemplary embodiments, the third transistor and the fourth transistor may be n-channel MOS transistors.

In some exemplary embodiments, the first power supply voltage may be greater than the reference voltage, the initialization voltage, and the data voltage.

In some exemplary embodiments, the second transistor may be configured to receive the data voltage through a data line, and the third transistor may be configured to receive the reference voltage through a reference voltage line different from the data line.

In some exemplary embodiments, the reference voltage may be greater than the initialization voltage.

In some exemplary embodiments, the first transistor may further include a second gate connected to the second node.

In some exemplary embodiments, the first transistor may be an n-channel MOS transistor.

According to some exemplary embodiments, a display device includes a display panel including a plurality of pixels, and a panel driver configured to drive the display panel. At least one pixel among the pixels includes first to fifth transistors, first and second capacitors, and a light emitting element. The first transistor includes a gate connected to a first node, a first terminal, and a second terminal connected to a second node. The second transistor includes a gate configured to receive a first gate signal, a first terminal configured to receive a data voltage, and a second terminal connected to the first node. The third transistor includes a gate configured to receive a second gate signal, a first terminal configured to receive a reference voltage, and a second terminal connected to the first node. The fourth transistor includes a gate configured to receive a third gate signal, a first terminal configured to receive an initialization voltage, and a second terminal connected to the second node. The fifth transistor includes a gate configured to receive the first gate signal, a first terminal configured to receive a first power supply voltage, and a second terminal connected to the first terminal of the first transistor. The first capacitor includes a first electrode connected to the first node, and a second electrode connected to the second node. The second capacitor includes a first electrode connected to the second node, and a second electrode configured to receive the first power supply voltage. The light emitting element includes a first terminal connected to the second node, and a second terminal configured to receive a second power supply voltage.

In some exemplary embodiments, a frame period of the display device may include: a first period in which the first node and the second node are initialized; a second period in which a threshold voltage of the first transistor is sensed; a third period in which the data voltage is applied to the first transistor; and a fourth period in which the light emitting element emits light based on the data voltage.

In some exemplary embodiments, a length of the second period may be longer than one horizontal period.

In some exemplary embodiments, a length of the third period may be one horizontal period.

In some exemplary embodiments, in the first period: the third transistor, the fourth transistor, and the fifth transistor may be configured to be turned on; and the second transistor may be configured to be turned off.

In some exemplary embodiments, in the second period: the third transistor and the fifth transistor may be configured to be turned on; and the second transistor and the fourth transistor may be configured to be turned off.

In some exemplary embodiments, in the third period: the second transistor may be configured to be turned on; and the third transistor, the fourth transistor and the fifth transistor may be configured to be turned off.

In some exemplary embodiments, in the fourth period: the fifth transistor may be configured to be turned on; and the second transistor, the third transistor, and the fourth transistor may be configured to be turned off.

In some exemplary embodiments, the second transistor may be an n-channel metal oxide semiconductor (MOS) transistor; and the fifth transistor may be a p-channel MOS transistor.

In some exemplary embodiments, the second transistor may be configured to receive the data voltage through a data line; and the third transistor may be configured to receive the reference voltage through a reference voltage line different from the data line.

In some exemplary embodiments, the first transistor may further include a second gate connected to the second node.

According to some exemplary embodiments, a pixel includes first to fifth transistors, first and second capacitors, and a light emitting element. The first transistor includes a gate connected to a first node, a first terminal, and a second terminal connected to a second node. The second transistor includes a gate configured to receive a first gate signal, a first terminal configured to receive a data voltage, and a second terminal connected to the first node. The third transistor includes a gate configured to receive a second gate signal, a first terminal configured to receive a reference voltage, and a second terminal connected to the first node. The fourth transistor includes a gate configured to receive a third gate signal, a first terminal configured to receive an initialization voltage, and a second terminal connected to the second node. The fifth transistor includes a gate configured to receive a fourth gate signal, a first terminal configured to receive a first power supply voltage, and a second terminal connected to the first terminal of the first transistor. The first capacitor includes a first electrode connected to the first node, and a second electrode connected to the second node.

The second capacitor includes a first electrode connected to the second node, and a second electrode configured to receive the first power supply voltage. The light emitting element includes a first terminal connected to the second node, and a second terminal configured to receive a second power supply voltage.

According to various exemplary embodiments, a pixel may receive a data voltage through a data line, and may receive a reference voltage independently of the data voltage through a reference voltage line. In this manner, a threshold voltage sensing period of a pixel may be separated from a data writing period and a gate signal may be adjusted such that the threshold voltage sensing period has a sufficient length, and, as such, the length of the threshold voltage sensing period may be set longer than one horizontal period (e.g., 10 horizontal periods (10H)). Therefore, the pixel may prevent or at least reduce image quality degradation typically caused in a relatively high resolution display device and/or a display device driven with a relatively high frequency.

In one or more exemplary embodiments, the pixel may be implemented with a complementary metal-oxide-semiconductor (CMOS) circuit including an n-channel MOS transistor and a p-channel MOS transistor, and, thus, a number of control signals (e.g., gate signals) and a number of lines for the control signals may be reduced. Further, in the pixel, a transistor to which a relatively high voltage may be applied may be implemented with the p-channel MOS transistor, and a voltage level of a corresponding gate signal may be lowered to thereby reduce a deterioration of the transistor. Further, according to some exemplary embodiments, a driving transistor of the pixel may be implemented with the n-channel MOS transistor to thereby reduce an afterimage typically caused by hysteresis of the driving transistor.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

FIGS. 5A and 5B are timing diagrams for describing exemplary operation of the display device of FIG. 1 according to some exemplary embodiments.

DETAILED DESCRIPTION OF THE ILLUSTRATED EMBODIMENTS

Figure 1:
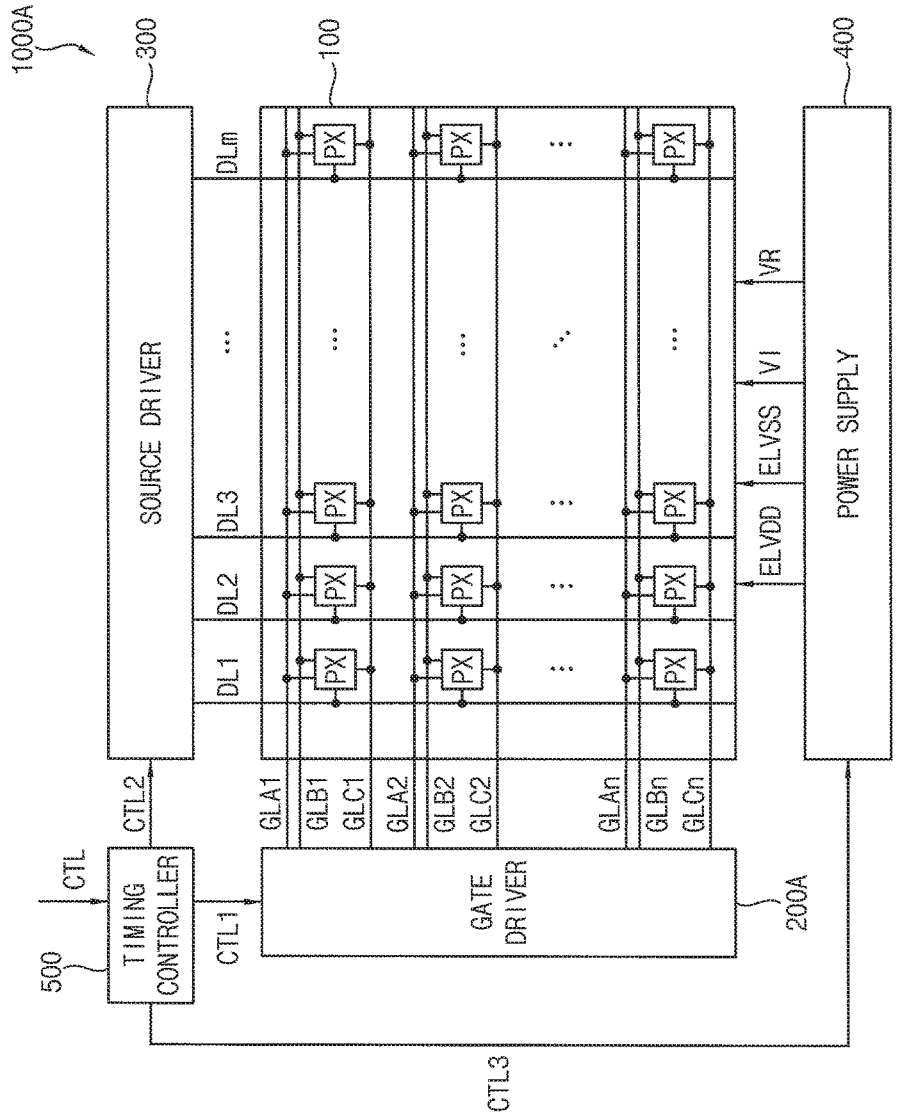
FIG. 1 is a block diagram illustrating a display device according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. To this end, the term "connected" may refer to physical, electrical, and/or fluid connection. Further, the D1-axis, the D2-axis, and the D3-axis are not limited to three axes of a rectangular coordinate system, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the spirit and scope of the inventive concepts. Further, the blocks, units, and/or modules of some exemplary embodiments may be physically combined into more complex blocks, units, and/or modules without departing from the inventive concepts.

FIG. 1 is a block diagram illustrating a display device according to some exemplary embodiments.

Referring to FIG. 1, a display device 1000A may include a display panel 100 including a plurality of pixels PX, and a panel driver for driving the display panel 100. In some exemplary embodiments, the panel driver may include a gate driver 200A, a source driver 300, a power supply 400, and a timing controller 500. In some exemplary embodiments, the display device 1000A may be an organic light emitting display device.

The display panel 100 may include the plurality of pixel PX to display an image. For example, the display panel 100 may include n*m pixels PX at locations corresponding to crossing points of gate lines GLA1 through GLAn and data lines DL1 through DLm, where n and m are integers greater than 1. Each pixel PX may compensate a threshold voltage of a driving transistor in a source follower manner. To compensate the threshold voltage, the pixel PX may receive a reference voltage VR, which is applied to a gate of the driving transistor through a reference voltage line, and may receive a data voltage through a data line among the data lines DL1 through DLm. The display device 1000A may separate a threshold voltage sensing period from a data writing period, and may adjust a gate signal such that the threshold voltage sensing period (or a threshold voltage compensation period) has a sufficient length. In this manner, the threshold voltage sensing period may be set independently of the data writing period, and the length of the threshold voltage sensing period may be set longer than 1 horizontal period (1H), such as 10 horizontal periods (10H).

In some exemplary embodiments, the pixel PX may be implemented with a complementary metal oxide semiconductor (CMOS) circuit including an n-channel MOS transistor and a p-channel MOS transistor. Accordingly, the number of one or more control signals (e.g., one or more gate signals) and the number of lines for the one or more control signals may be reduced. A configuration and an operation of the pixel PX will be described below with reference to FIGS. 2, 3, 4A through 4D, 5A, 5B, and 6.

Based on a first control signal CTL1, the gate driver 200A may provide a first gate signal to the pixels PX through first gate lines GLA1 through GLAn, may provide a second gate signal to the pixels PX through second gate lines GLB1 through GLBn, and may provide a third gate signal to the pixels PX through third gate lines GLC1 through GLCn. Here, the first gate signal may be a control signal for applying the data voltage and controlling emission of the pixels PX. The second gate signal may be a control signal for applying the reference voltage VR to the pixels PX. The third gate signal may be a control signal for applying an initialization voltage VI to the pixels PX.

The source driver 300 may convert digital image data into an analog-type data voltage, and may provide the data voltage to the pixels PX via the data lines DL1 through DLm based on a second control signal CTL2.

The power supply 400 may provide a first power supply voltage ELVDD, a second power supply voltage ELVSS, the initialization voltage VI, and the reference voltage VR to the pixels PX based on a third control signal CNT3. For example, the power supply 400 may include a DC-DC converter that generates output voltages having various voltage levels from an input voltage (e.g., a battery voltage).

The timing controller 500 may control the gate driver 200A, the source driver 300, and the power supply 400. For example, the timing controller 500 may receive a control signal CNT from an external device (e.g., a system board). The timing controller 500 may generate the first through third control signals CTL1 through CTL3 to control the gate driver 200A, the source driver 300, and the power supply 400. The first control signal CTL1 for controlling the gate driver 200A may include a scan start signal, a scan clock signal, etc. The second control signal CTL2 for controlling the source driver 300 may include a horizontal start signal, a load signal, image data, etc. The third control signal CTL3 for controlling the power supply 400 may include a control signal for controlling voltage levels. The timing controller 500 may generate digital image data suitable for operating conditions of the display panel 100 based on the input image data, and may provide the generated image data to the data driver 300.

As described above, the display device 1000A according to some exemplary embodiments may separate the threshold voltage sensing period from the data writing period, and may receive the reference voltage VR independently of the data voltage such that a time for compensating the threshold voltage of the driving transistor is sufficient, for example, for a relatively high resolution display device or a display device driven with a relatively high frequency.

Figure 2:
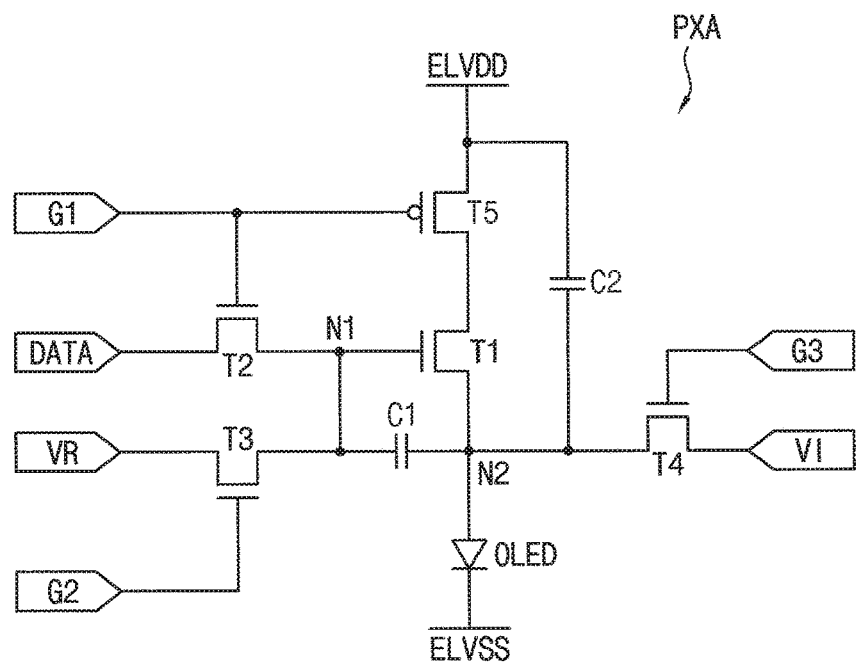
FIG. 2 is a circuit diagram illustrating a pixel included in the display device of FIG. 1 according to some exemplary embodiments.

FIG. 2 is a circuit diagram illustrating a pixel included in the display device of FIG. 1 according to some exemplary embodiments. The pixel PXA of FIG. 2 may be representative of one or more pixels PX of the display device 1000A of FIG. 1.

Referring to FIGS. 1 and 2, the pixel PXA may include a first transistor T1, a second transistor T2, a third transistor T3, a fourth transistor T4, a fifth transistor T5, a first capacitor C1, a second capacitor C2, and a light emitting element OLED. The pixel PXA may be located at an i-th pixel row and a j-th pixel column, where i an integer between 1 and n, and j is an integer between 1 and m. The pixel PXA may be implemented with an n-channel MOS transistor and a p-channel MOS transistor.

The first transistor T1 may be a driving transistor operating in a saturation region. The first transistor T1 may be connected between a first power supply voltage ELVDD and a second node N2, and may provide a driving current corresponding to a data voltage DATA to the light emitting element OLED. For example, the first transistor T1 may include a gate connected to a first node N1, a first terminal connected to a second terminal of the fifth transistor T5, and a second terminal connected to the second node N2. In some exemplary embodiments, the first transistor T1 may be an n-channel MOS transistor. Since the n-channel MOS transistor is less affected by hysteresis than a p-channel MOS transistor, a display device 1000A including the pixel PXA may reduce an afterimage caused by the hysteresis.

The second transistor T2 may transfer a data voltage DATA received through a data line DLj corresponding to the j-th pixel column to the first node N1 in response to a first gate signal G1 received through a first gate line GLAi corresponding to the i-th pixel row. For example, the second transistor T2 may include a gate receiving the first gate signal G1, a first terminal receiving the data voltage DATA, and a second terminal connected to the first node N1.

The third transistor T3 may transfer a reference voltage VR to the first node N1 in response to a second gate signal G2 received through a second gate line GLBi corresponding to the i-th pixel row. For example, the third transistor T3 may include a gate receiving the second gate signal G2, a first terminal receiving the reference voltage VR, and a second terminal connected to the first node N1.

In some exemplary embodiments, the second transistor T2 may receive the data voltage DATA through the data line DLj, and the third transistor T3 may receive the reference voltage VR through a reference voltage line different from the data line DLj. Thus, since the reference voltage VR is received through the reference voltage line different from the data line DLj, a length of a threshold voltage sensing period may not be limited to 1H, and may be adjusted to a desired length. Here, 1H may mean a period in which a source driver provides the data voltage DATA to one horizontal line (i.e., one pixel row). For example, in a case where a frame rate of the display device 1000A is 120 Hz and one frame period includes 1936 horizontal periods, 1H may be about 4.3 μs (i.e., 1/120/1936=about 4.3 μs).

The fourth transistor T4 may transfer an initialization voltage VI to the second node N2 in response to a third gate signal G3 received through a third gate line GLCi corresponding to the i-th pixel row. For example, the fourth transistor T4 may include a gate receiving the third gate signal G3, a first terminal receiving the initialization voltage VI, and a second terminal connected to the second node N2. The fourth transistor T4 may initialize a voltage of the second node N2 to perform a threshold voltage compensation operation for the driving transistor in a source follower manner, and, at the same time, may initialize a voltage of the light emitting element OLED (or discharge a parasitic capacitance of the light emitting element OLED) for the display device 1000A to accurately display a black image.

In some exemplary embodiments, the third transistor T3 and the fourth transistor T4 may be n-channel MOS transistors. Thus, the third transistor T3 and the fourth transistor T4 may receive the reference voltage VR and the initialization voltage VI that are relatively low voltages, and voltage levels of gate signals (i.e., the second gate signal G2 and the third gate signal G3) may be lowered since the third and fourth transistors T3 and T4 are implemented with the n-channel MOS transistors.

The fifth transistor T5 may transfer the first power supply voltage ELVDD to the first transistor T1 in response to the first gate signal G1. For example, the fifth transistor T5 may include a gate receiving the first gate signal G1, a first terminal receiving the first power supply voltage ELVDD, and a second terminal connected to the first terminal of the first transistor T1.

In some exemplary embodiments, the second transistor T2 may be turned on when the first gate signal G1 has a first logic level, and the fifth transistor T5 may be turned on when the first gate signal has a second logic level different from the first logic level. The second transistor T2 and the fifth transistor T5 may be implemented with different types of MOS transistors. For example, the second transistor T2 may be an n-channel MOS transistor, and the fifth transistor T5 may be a p-channel MOS transistor. Thus, the second transistor T2 or the fifth transistor T5 may be selectively turned on in response to the same first gate signal G1. Accordingly, the number of lines connected to the second and fifth transistors T2 and T5 may be reduced compared with the case where the second and fifth transistors T2 and T5 receive different gate signals.

In some exemplary embodiments, the first power supply voltage ELVDD may be higher than the reference voltage VR, the initialization voltage VI, and the data voltage DATA. That is, the fifth transistor T5 may receive the first power supply voltage ELVDD that is a relatively high voltage, the second transistor T2 may receive the data voltage DATA that is a relatively low voltage, the fifth transistor T5 may be implemented with a p-channel MOS transistor, the second transistor T2 may be implemented with an n-channel MOS transistor, and thus, a voltage level of the first gate signal G1 may be lowered.

The first capacitor C1 may be connected between the first node N1 and the second node N2. For example, the first capacitor C1 may include a first electrode connected to the first node N1, and a second electrode connected to the second node N2.

The second capacitor C2 may be connected between the second node N2 and the first power supply voltage ELVDD. For example, the second capacitor C2 may include a first electrode connected to the second node N2, and a second electrode receiving the first power supply voltage ELVDD.

The light emitting element OLED may include a first terminal (e.g., an anode) connected to the second node N2, and a second terminal (e.g., a cathode) receiving a second power supply voltage ELVSS. For example, the light emitting element OLED may be an organic light emitting diode.

The pixel PXA of FIG. 2 may be implemented with a CMOS circuit having one connection point at which the p-channel MOS transistor and the n-channel MOS transistor are connected, thereby minimizing a size increase.

FIGS. 3, 4A, 4B, 4C, and 4D are diagrams to facilitate exemplary operation of the pixel of FIG. 2 according to some exemplary embodiments.

Referring to FIGS. 2, 3, and 4A through 4D, one frame period for a pixel PXA may include a first period P1 in which a first node N1 and a second node N2 are initialized, a second period P2 in which a threshold voltage of a first transistor T1 is sensed, a third period P3 in which a data voltage DATA is applied to the first transistor T1, and a fourth period P4 in which a light emitting element OLED emits light based on the data voltage DATA.

Figure 3:
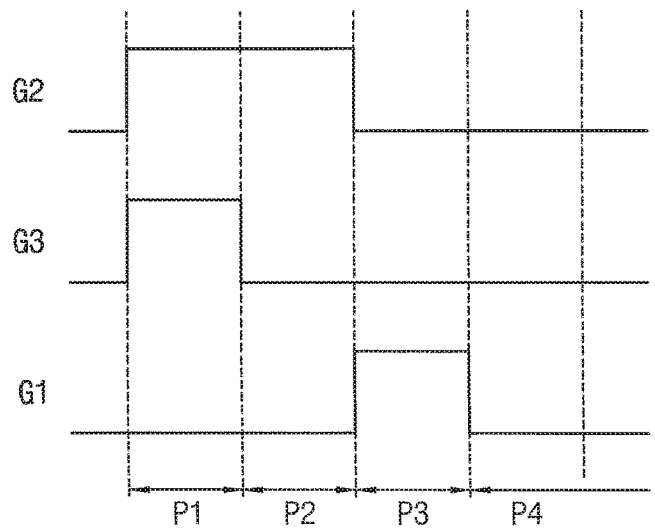
FIGS. 3, 4A, 4B, 4C, and 4D are diagrams to facilitate exemplary operation of the pixel of FIG. 2 according to some exemplary embodiments.
Figure 4A:
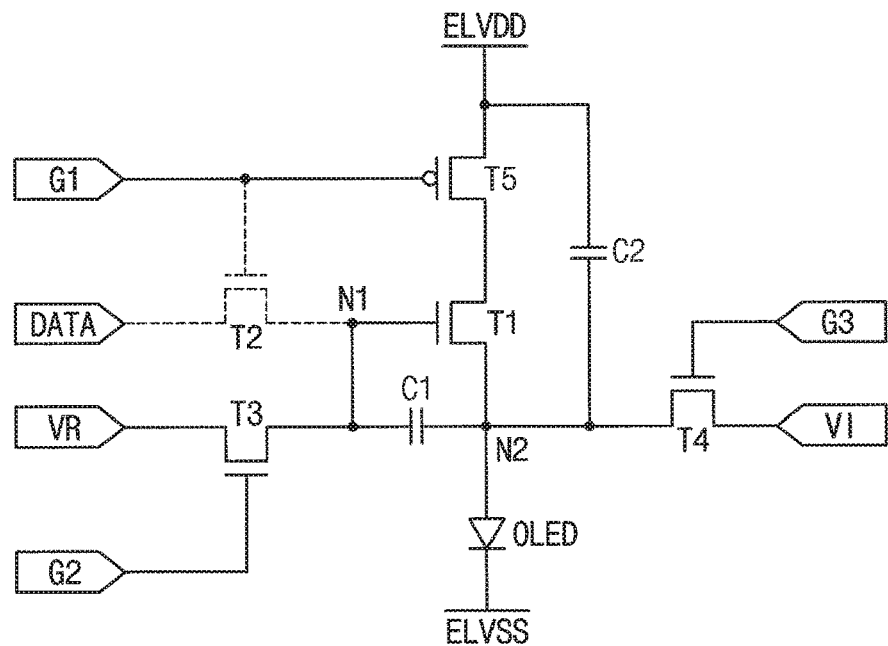

As illustrated in FIGS. 3 and 4A, in the first period P1 (e.g., an initialization period), the first node N1 and the second node N2 may be initialized (or an initialization operation may be performed). For example, during the first period P1, a second gate signal G2 and a third gate signal G3 may have a first logic level, and a first gate signal G1 may have a second logic level. Here, the first logic level may be a high voltage level (e.g., about 10V), and the second logic level may be a low voltage level (e.g., about 0V). A third transistor T3, a fourth transistor T4, and a fifth transistor T5 may be turned on, and a second transistor T2 may be turned off. Thus, a voltage of the first node N1 may be set to a reference voltage VR via the turned-on third transistor T3, and a voltage of the second node N2 may be set to an initialization voltage VI via the turned-on fourth transistor T4. Here, to sense a threshold voltage of the first transistor T1 (or a driving transistor) in a source follower manner, the reference voltage VR may be higher than the initialization voltage VI. For example, the reference voltage VR may be about 1.5V, and the initialization voltage VI may be about 0V.

Figure 4B:
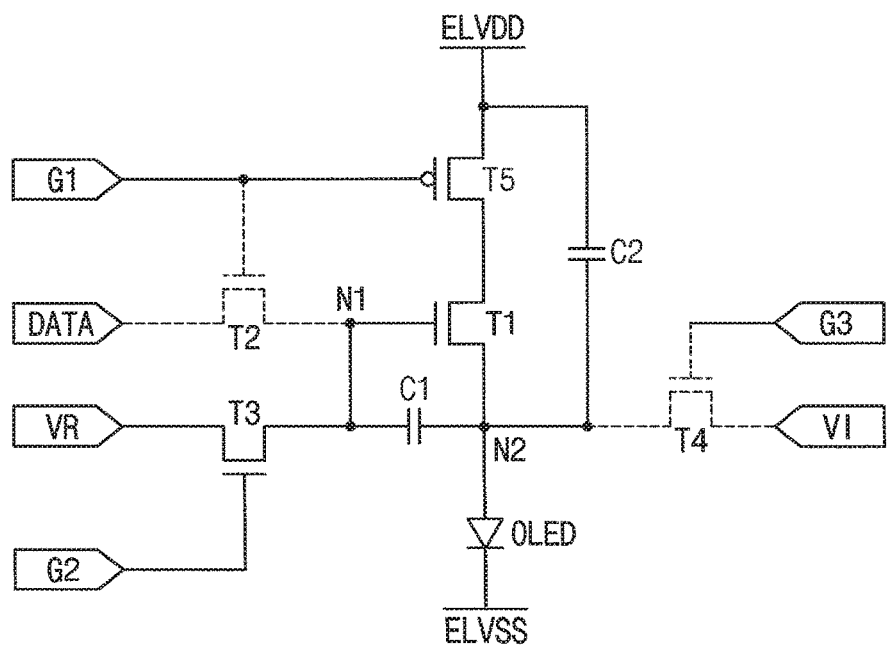

As illustrated in FIGS. 3 and 4B, in the second period P2, the threshold voltage of the driving transistor (i.e., the first transistor T1) may be sensed (or a threshold voltage compensation operation may be performed) in the source follower manner. For example, during the second period P2, the second gate signal G2 may have the first logic level, and the first gate signal G1 and the third gate signal G3 may have the second logic level. The third transistor T3 and the fifth transistor T5 may be turned on, and the second transistor T2 and the fourth transistor T4 may be turned off. Thus, during the second period P2, the voltage of the first node N1 may be maintained as the reference voltage VR by the turned-on third transistor T3, and the voltage of the second node N2 may be changed from the initialization voltage VI to a voltage according to Equation 1 through a source follower operation.

$$VN2 = VR - Vth \qquad \text{Equation 1}$$

Here, VN2 represents the voltage of the second node N2, VR represents the reference voltage, and Vth represents the threshold voltage of the first transistor T1.

Figure 4C:
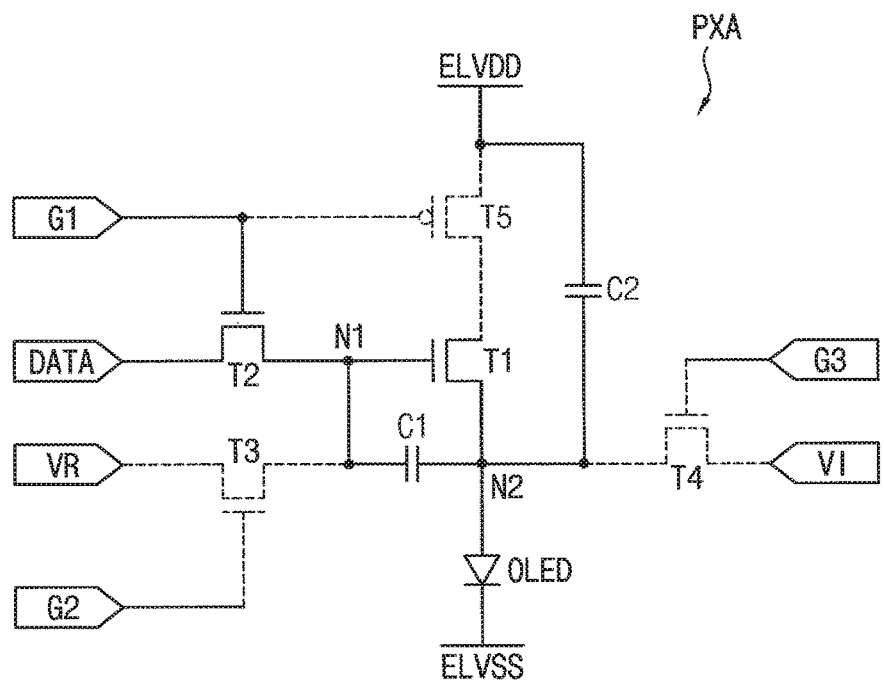

As illustrated in FIGS. 3 and 4C, in the third period P3, the data voltage DATA may be applied to a gate of the driving transistor (i.e., the first transistor T1) (or a data writing operation may be performed). For example, during the third period P3, the first gate signal G1 may have the first logic level, and the second gate signal G2 and the third gate signal G3 may have the second logic level. The second transistor T2 may be turned on, and the third transistor T3, the fourth transistor T4 and the fifth transistor T5 may be turned off. Thus, during the third period P3, the voltage of the first node N1 may be set as the data voltage DATA via the turned-on second transistor T2, and the voltage of the second node N2 may be changed according to a change of the voltage of the first node N1 based on a capacitance of first and second capacitors C1 and C2 connected in series. For example, the voltage of the second node N2 may be changed to a voltage according to Equation 2.

$$VN2 = VR - Vth + \frac{C1}{C1 + C2}(Vdata - VR) \qquad \text{Equation 2}$$

Here, VN2 represents the voltage of the second node N2, VR represents the reference voltage, Vth represents the threshold voltage of the first transistor T1, C1 represent a capacitance of the first capacitor, C2 represents a capacitance of the second capacitor, and Vdata represents the data voltage.

Figure 4D:
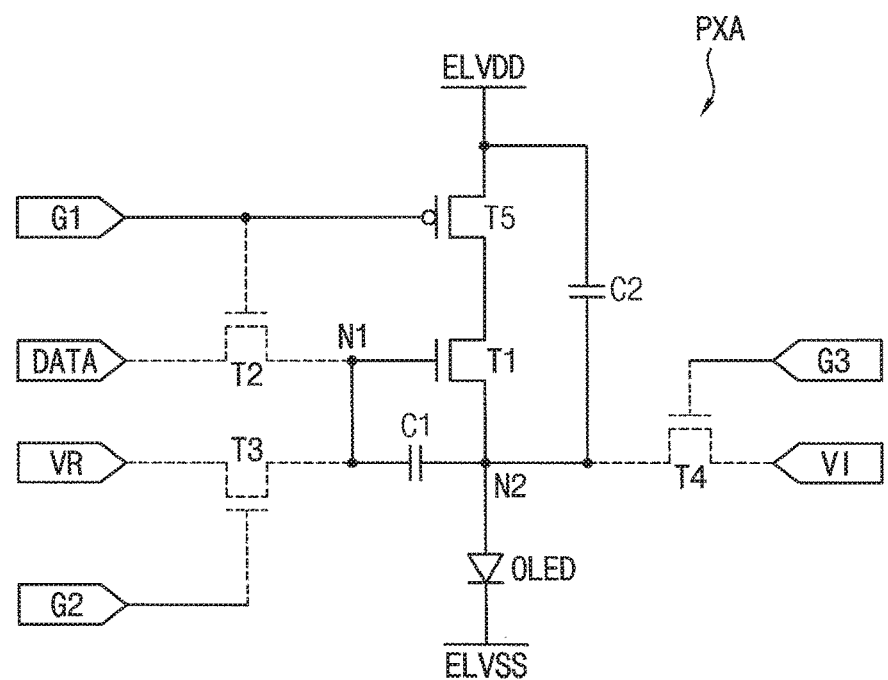

As illustrated in FIGS. 3 and 4D, in the fourth period P4, a light emitting diode OLED may emit light based on a driving current corresponding to the data voltage DATA. For example, during the fourth period P4, the first gate signal G1, the second gate signal G2 and the third gate signal G3 may have the second logic level. The fifth transistor T5 may be turned on, and the second transistor T2, the third transistor T3 and the fourth transistor T4 may be turned off. Thus, in the fourth period T4, the driving current may be generated based on a voltage difference between a gate and a source of the first transistor T1, and the light emitting diode OLED may emit light based on the driving current. For example, the driving current provided to the light emitting diode OLED may be calculated according to Equation 3

$$Id = \left(\frac{k}{2}\right)\left[\frac{C2}{C1 + C2}(Vdata - VR)\right]^2 \qquad \text{Equation 3}$$

Here, k represents a constant according to a characteristic of the first transistor T1, C1 represents the capacitance of the first capacitor, C2 represents the capacitance of the second capacitor, Vdata represents the data voltage, and VR represents the reference voltage.

Figure 5B:
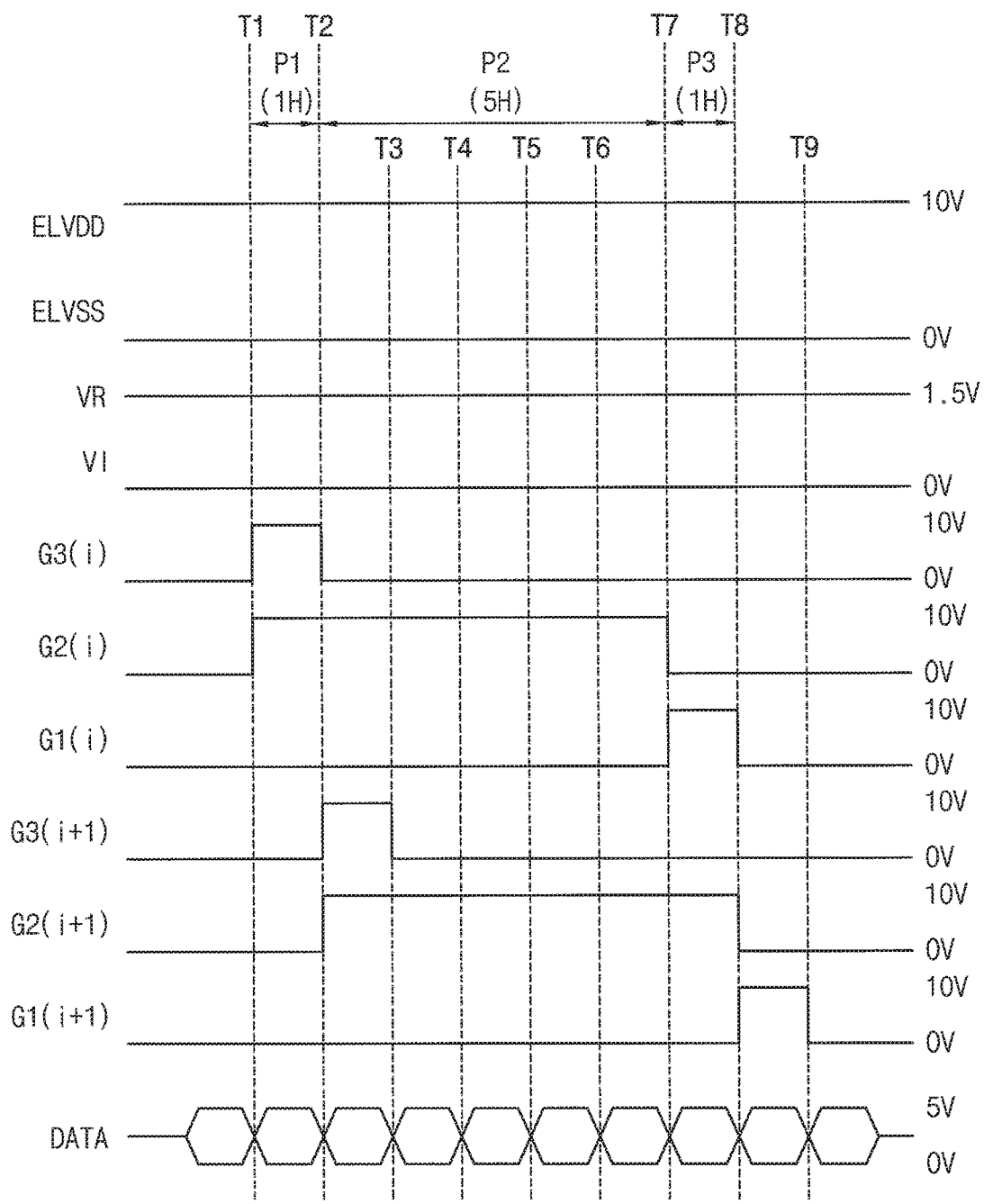

FIGS. 5A and 5B are timing diagrams for describing exemplary operation of the display device of FIG. 1 according to some exemplary embodiments.

Referring to FIGS. 5A and 5B, a pixel may receive a data voltage DATA through a data line, and may receive a reference voltage VR through a reference voltage line, and thus, a display device may set a length of a threshold voltage sensing period for each pixel row to be longer than 1H.

In some exemplary embodiments, as illustrated in FIG. 5A, the display device may adjust a length of an on-period of a second gate signal G2($i$) and G2($i$+1) applied to the pixel and timings of gate signals G1($i$), G2($i$), G3($i$), G1($i$+1), G2($i$+1) and G3($i$+1) such that a length of a second period P2 in which a threshold voltage of a driving transistor is sensed may be set to 3H.

A third gate signal G3($i$) applied to an i-th pixel row may have a first logic level for 1H from a first time point T1. A second gate signal G2($i$) applied to the i-th pixel row may have the first logic level for 4H from the first time point T1. A first gate signal G1($i$) applied to the i-th pixel row may have the first logic level for 1H from a fifth time point T5.

Gate signals G1($i$+1), G2($i$+1) and G3($i$+1) applied to an (i+1)-th pixel row may be delayed by 1H from the gate signals G1($i$), G2($i$) and G3($i$) applied to the i-th pixel row. For example, the third gate signal G3($i$+1) applied to the (i+1)-th pixel row may have the first logic level for 1H from a second time point T2. The second gate signal G2($i$+1) applied to the (i+1)-th pixel row may have the first logic level for 4H from the second time point T2. The first gate signal G1($i$+1) applied to the (i+1)-th pixel row may have the first logic level for 1H from a sixth time point T6. As such, respective pixels may sequentially perform an initialization operation for 1H, a threshold voltage compensation operation for 3H, and a data writing operation for 1H.

In some exemplary embodiments, the first logic level of the gate signals G1($i$), G2($i$), G3($i$), G1($i$+1), G2($i$+1), and G3($i$+1) may be about 10V, and a second logic level of the gate signals G1($i$), G2($i$), G3($i$), G1($i$+1), G2($i$+1), and G3($i$+1) may be about 0V. A transistor to which a relatively low voltage is applied may be implemented with an n-channel MOS transistor, and a transistor to which a relatively high voltage is applied may be implemented with a p-channel MOS transistor. Thus, the first and second logic levels of the gate signals G1(i), G2(i), G3(i), G1(i+1), G2(i+1), and G3(i+1) may be relatively low voltage levels compared with gate signal of a conventional display device. For example, second through fourth transistors to which relatively low reference voltage (e.g., about 1.5V), initialization voltage (e.g., about 0V), and data voltage (e.g., from about 0V to about 5V) are applied may be implemented with n-channel MOS transistors, and a fifth transistor to which a relatively high first power supply voltage (e.g., about 10V) is applied may be implemented with a p-channel MOS transistor. Accordingly, a gate driver may generate the gate signals G1(i), G2(i), G3(i), G1(i+1), G2(i+1), and G3(i+1) without an additional voltage boosting circuit, and deterioration of the transistors in the pixel PXA may be reduced.

In other exemplary embodiments, as illustrated in FIG. 5B, the display device may adjust the length of the on-period of the second gate signal G2(i) and G2(i+1) applied to the pixel and timings of the gate signals G1(i), G2(i), G3(i), G1(i+1), G2(i+1), and G3(i+1) such that the length of the second period P2 in which the threshold voltage of the driving transistor is sensed may be set to 5H. The third gate signal G3(i) applied to the i-th pixel row may have the first logic level for 1H from the first time point T1. The second gate signal G2(i) applied to the i-th pixel row may have the first logic level for 6H from the first time point T1. The first gate signal G1(i) applied to the i-th pixel row may have the first logic level for 1H from a seventh time point T7. The gate signals G1(i+1), G2(i+1) and G3(i+1) applied to the (i+1)-th pixel row may be delayed by 1H from the gate signals G1(i), G2(i) and G3(i) applied to the i-th pixel row. Accordingly, respective pixels may sequentially perform the initialization operation for 1H, the threshold voltage compensation operation for 5H and the data writing operation for 1H.

Lengths of the first period P1 and the second period P2 may not be limited to examples illustrated in FIGS. 5A and 5B. The lengths of the first period P1 and the second period P2 may be set in various ranges where the initialization operation and the threshold voltage compensation operation are normally performed. Further, although FIGS. 5A and 5B illustrate examples where the first logic level is about 10V and the second logic level is about 0V, the first and second logic levels may not be limited thereto. For example, the first logic levels and/or the second logic levels of the first through third gate signals may be different from each other.

Figure 6:
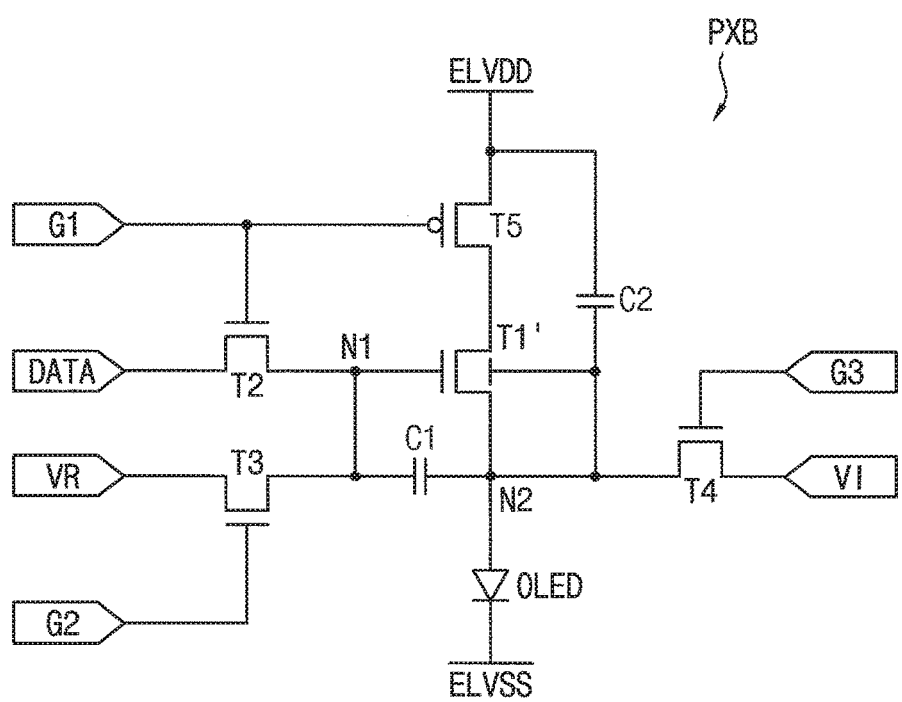
FIG. 6 is a circuit diagram illustrating a pixel included in a display device according to some exemplary embodiments.
Figure 7:
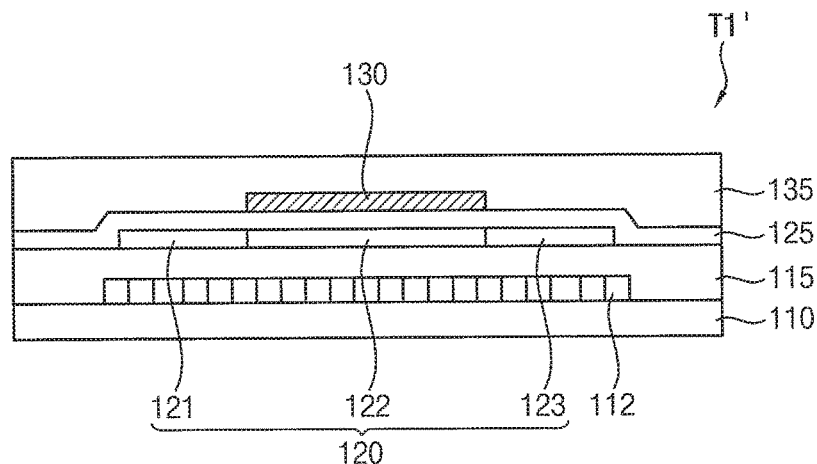
FIG. 7 is a cross-sectional diagram illustrating a driving transistor included in the pixel of FIG. 6 according to some exemplary embodiments.
Figure 8:
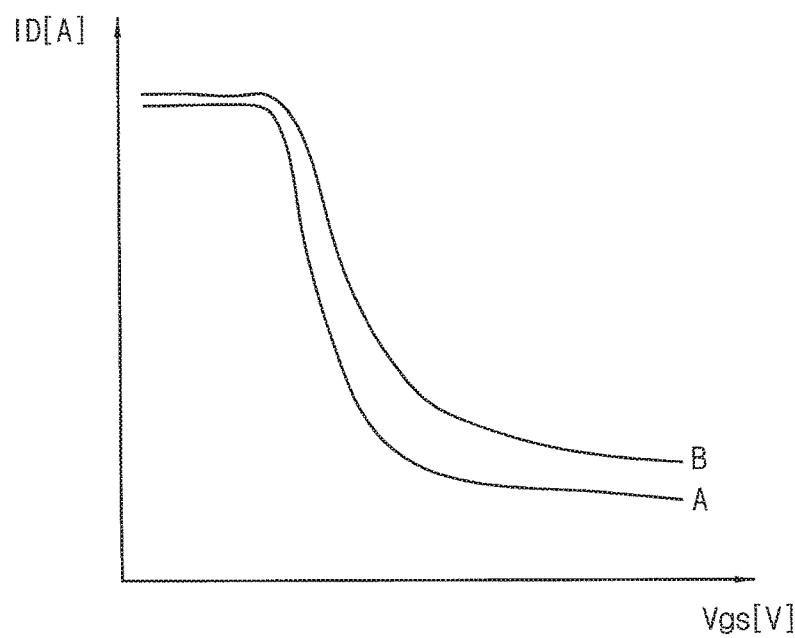
FIG. 8 is a graph for describing a characteristic of the driving transistor of FIG. 7 according to some exemplary embodiments.

FIG. 6 is a circuit diagram illustrating a pixel included in a display device according to some exemplary embodiments. FIG. 7 is a cross-sectional diagram illustrating a driving transistor included in the pixel of FIG. 6 according to some exemplary embodiments. FIG. 8 is a graph for describing a characteristic of the driving transistor of FIG. 7 according to some exemplary embodiments. It is noted that the pixel PXB of FIG. 6 may be included in the display device 1000A of FIG. 1.

Referring to FIGS. 6 through 8, the pixel PXB may include a first transistor T1', a second transistor T2, a third transistor T3, a fourth transistor T4, a fifth transistor T5, a first capacitor C1, a second capacitor C2, and a light emitting element OLED. The pixel PXB may be substantially the same as the pixel PXA of FIG. 2, except that the first transistor T1' may be a double gate transistor. The same or similar reference numerals may be used to indicate the same or similar elements, and duplicated descriptions are primarily omitted.

The first transistor T1' may be a driving transistor. The first transistor T1' may be connected between a first power supply voltage ELVDD and a second node N2, and may provide a driving current corresponding to a data voltage DATA to the light emitting element OLED. For example, the first transistor T1' may include a first gate connected to a first node N1, a second gate connected to the second node N2, a first terminal connected to a second terminal of the fifth transistor T5, and a second terminal connected to the second node N2.

In some exemplary embodiments, as illustrated in FIG. 7, the first transistor T1' may be a double gate transistor including a lower gate layer under an active layer. For example, the first transistor T1' may include a substrate 110, a lower gate layer 112 on the substrate 110, a first gate insulation layer 115 on the lower gate layer 112, an active layer 120 on the first gate insulation layer 115, a second gate insulation layer 125 on the active layer 120, an upper gate pattern 130 on the second gate insulation layer 125, and an interlayer insulation layer 135 on the upper gate pattern 130.

The substrate 110 may include an insulation material. For example, the substrate 110 may include, but is not limited to, a glass substrate, a transparent plastic substrate, a transparent metal oxide substrate, etc. In some exemplary embodiments, at least one buffer layer may be provided on the substrate 110. For example the buffer layer may include, but not limited to, a silicon oxide, a silicon nitride, a silicon oxy-nitride, etc.

The lower gate layer 112 may be disposed on the substrate 110. The lower gate layer 112 may include, but not limited to, a metal, an alloy, a metal nitride, a conductive metal oxide, a transparent conductive material, etc. In some exemplary embodiments, the lower gate layer 112 may be the second gate of the first transistor T1', and may be electrically connected to the second node N2.

The first gate insulation layer 115 may cover the lower gate layer 112, and may be disposed on the substrate 110. In some exemplary embodiments, the first gate insulation layer 115 may have a substantially flat upper surface while covering cover the lower gate layer 112. The first gate insulation layer 115 may include, but not limited to, a silicon compound, a metal oxide, etc.

The active layer 120 may be disposed on the first gate insulation layer 115. The active layer 120 may include silicon. The active layer 120 may include impurity-doped regions 121 and 123. The impurity-doped regions 121 and 123 may correspond to the first terminal (e.g., a drain) and the second terminal (e.g., a source) of the first transistor T1', and may have an electrical conductivity higher than that of the remaining region 122.

The second gate insulation layer 125 may cover the active layer 120, and may be disposed on the first gate insulation layer 115. In some exemplary embodiments, the second gate insulation layer 125 may be disposed with a substantially uniform thickness according to a profile of the active layer 120 while covering cover the active layer 120. In other exemplary embodiments, the second gate insulation layer 125 may have a substantially flat upper surface while covering cover the active layer 120.

The upper gate pattern 130 may be disposed on the second gate insulation layer 125. The upper gate pattern 130 may include, but not limited to, a metal, an alloy, a metal nitride, a conductive metal oxide, a transparent conductive material, etc. In some exemplary embodiments, the upper gate pattern 130 may be the first gate of the first transistor T1', and may be electrically connected to the first node N1.

The interlayer insulation layer 135 may cover the upper gate pattern 130, and may be disposed on the second gate insulation layer 125. In some exemplary embodiments, the interlayer insulation layer 135 may have a substantially flat upper surface while covering cover the upper gate pattern 130. The interlayer insulation layer 135 may be formed of an organic material, such as a silicon compound, or an inorganic material, such as a transparent insulation resin. For example, the interlayer insulation layer 135 may include, but not limited to, a silicon oxide, a silicon nitride, a silicon oxy-nitride, etc.

As illustrated in FIG. 8, in a case where a first transistor has one gate (e.g., in case of a pixel PXA of FIG. 2), as indicated by A in FIG. 8, the first transistor may have a relatively low sub-threshold slope (or swing). However, in a case where the first transistor T1' has double gates (e.g., in case of the pixel PXB of FIG. 6), as indicated by B in FIG. 8, the first transistor T1' may have a relatively high sub-threshold slope. Accordingly, since the second gate of the first transistor T1' of the pixel PXB of FIG. 6 is connected to the second node N2, the first transistor T1' may have the relatively high sub-threshold slope, a relatively large voltage margin may be obtained, and a display device may readily represent a grayscale.

The second transistor T2 may transfer a data voltage DATA received through a data line corresponding to a j-th pixel column to the first node N1 in response to a first gate signal G1 received through a first gate line GLAi corresponding to an i-th pixel row. The third transistor T3 may transfer a reference voltage VR to the first node N1 in response to a second gate signal G2 received through a second gate line GLBi corresponding to the i-th pixel row. The fourth transistor T4 may transfer an initialization voltage VI to the second node N2 in response to a third gate signal G3 received through a third gate line GLCi corresponding to the i-th pixel row. The fifth transistor T5 may transfer the first power supply voltage ELVDD to the first transistor T1 in response to the first gate signal G1. The first capacitor C1 may be connected between the first node N1 and the second node N2. The second capacitor C2 may be connected between the second node N2 and the first power supply voltage ELVDD. The light emitting element OLED may include a first terminal (e.g., an anode) connected to the second node N2 and a second terminal (e.g., a cathode) receiving a second power supply voltage ELVSS. Configurations of the second through fifth transistors T2 through T5 and the first and second capacitors C1 and C2 are described above, and duplicated descriptions are omitted. Also, an operation of the pixel PXB of FIG. 6 may be substantially the same as an operation of the pixel PXA of FIG. 2, and duplicated descriptions are omitted.

Figure 9:
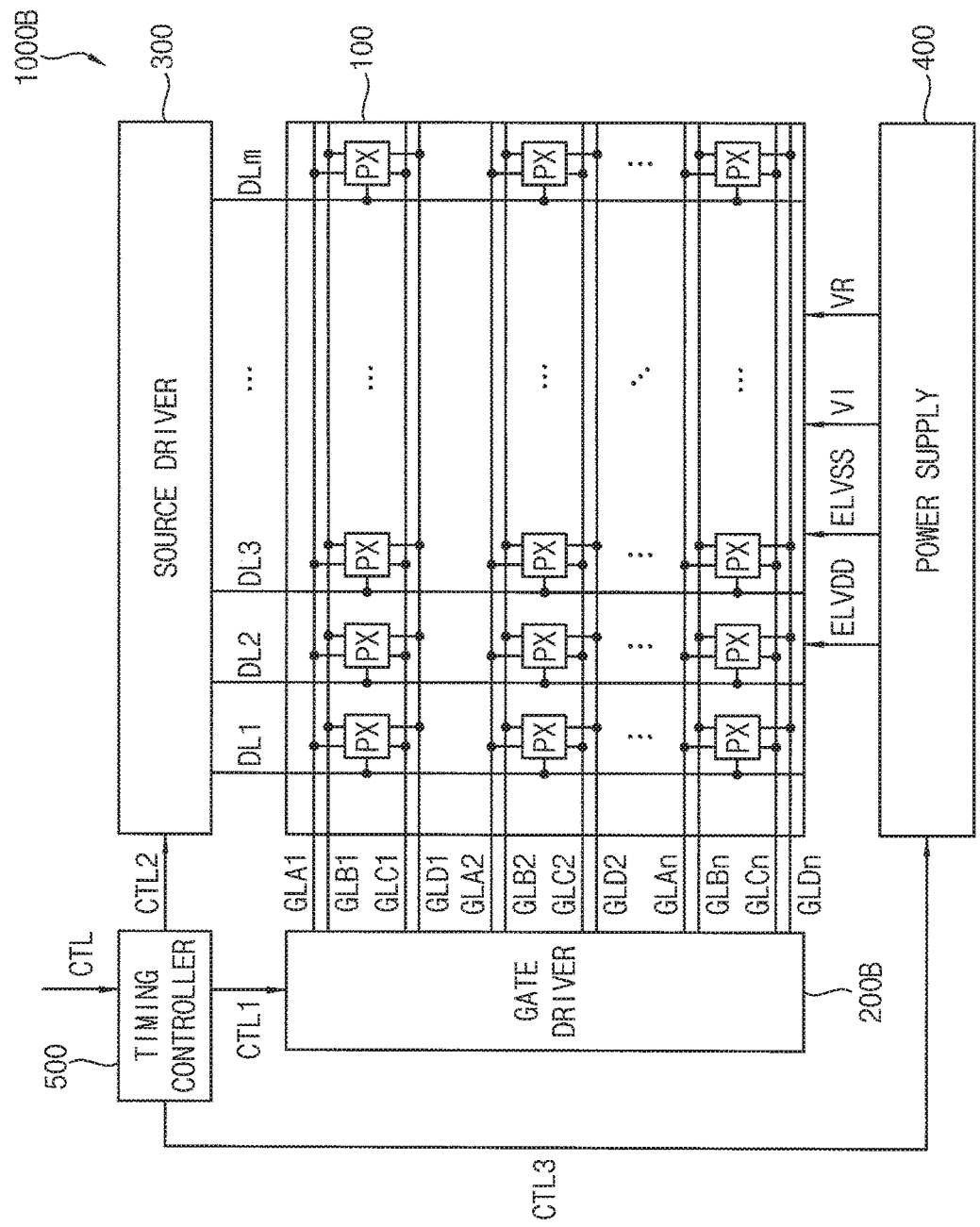
FIG. 9 is a block diagram illustrating a display device according to some exemplary embodiments.

FIG. 9 is a block diagram illustrating a display device according to some exemplary embodiments.

Referring to FIG. 9, a display device 1000B may include a display panel 100 including a plurality of pixels PX, and a panel driver for driving the display panel 100. In some exemplary embodiments, the panel driver may include a gate driver 200B, a source driver 300, a power supply 400, and a timing controller 500. The display device 1000B may be substantially the same as the display device 1000A of FIG. 1, except that the display device 1000B may further provide a fourth gate signal to the pixels PX through fourth gate lines GLD1 through GLDn. The same or similar reference numerals may be used to indicate the same or similar elements, and duplicated descriptions are primarily omitted.

The display panel 100 may include the plurality of pixel PX to display an image. Each pixel PX may compensate a threshold voltage of a driving transistor in a source follower manner. To compensate the threshold voltage, the pixel PX may receive a reference voltage VR, which is applied to a gate of the driving transistor through a reference voltage line, and may receive a data voltage through a data line among data lines DL1 through DLm. The display device 1000B may adjust a gate signal such that a threshold voltage sensing period (or a threshold voltage compensation period) has a sufficient length.

Based on a first control signal CTL1, the gate driver 200B may provide a first gate signal to the pixels PX through first gate lines GLA1 through GLAn, may provide a second gate signal to the pixels PX through second gate lines GLB1 through GLBn, may provide a third gate signal to the pixels PX through third gate lines GLC1 through GLCn, and may provide a fourth gate signal to the pixels PX through fourth gate lines GLD1 through GLDn. Here, the first gate signal may be a control signal for applying the data voltage. The second gate signal may be a control signal for applying the reference voltage VR to the pixels PX. The third gate signal may be a control signal for applying an initialization voltage VI to the pixels PX. The fourth gate signal may be a control signal for controlling emission of the pixels PX.

The source driver 300 may convert digital image data into an analog-type data voltage and may provide the data voltage to the pixels PX via the data lines DL1 through DLm based on a second control signal CTL2.

The power supply 400 may provide a first power supply voltage ELVDD, a second power supply voltage ELVSS, the initialization voltage VI, and the reference voltage VR to the pixels PX based on a third control signal CNT3.

The timing controller 500 may control the gate driver 200B, the source driver 300, and the power supply 400.

Figure 10:
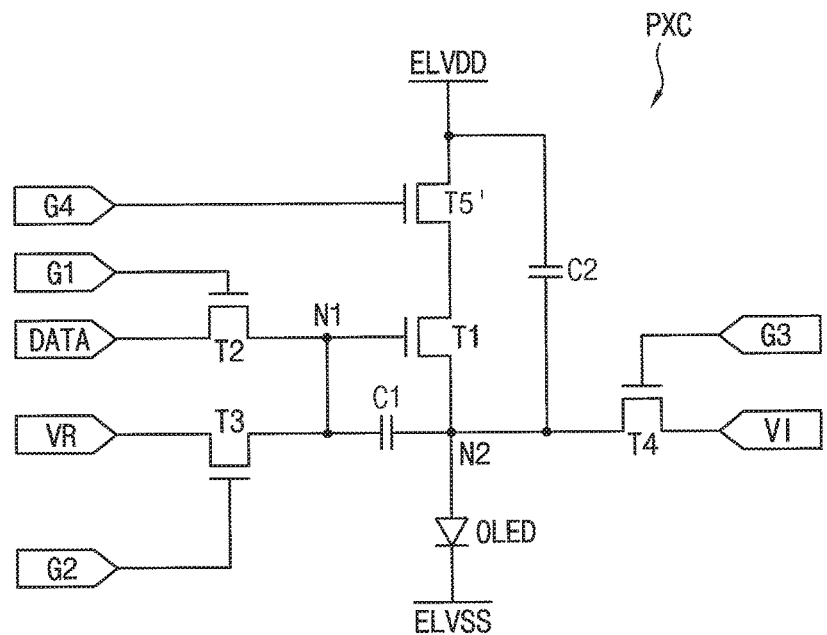
FIG. 10 is a circuit diagram illustrating a pixel included in the display device of FIG. 9 according to some exemplary embodiments.
Figure 11:
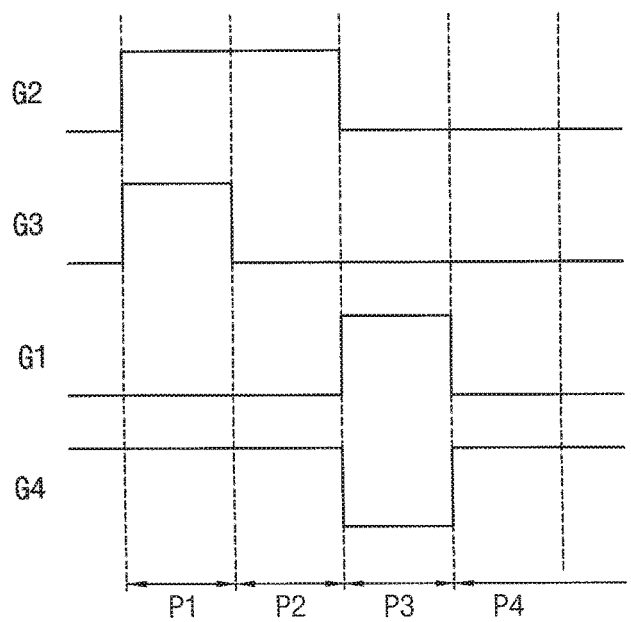
FIG. 11 is a timing diagram for describing exemplary operation of the pixel of FIG. 10 according to some exemplary embodiments.

FIG. 10 is a circuit diagram illustrating a pixel included in the display device of FIG. 9 according to some exemplary embodiments. FIG. 11 is a timing diagram for describing exemplary operation of the pixel of FIG. 10 according to some exemplary embodiments.

Referring to FIGS. 10 and 11, a pixel PXC may include a first transistor T1, a second transistor T2, a third transistor T3, a fourth transistor T4, a fifth transistor T5', a first capacitor C1, a second capacitor C2, and a light emitting element OLED. The pixel PXC may be substantially the same as the pixel PXA of FIG. 2, except that the fifth transistor T5' is an n-channel MOS transistor, and a fourth gate signal G4 is received. The same or similar reference numerals may be used to indicate the same or similar elements, and duplicated descriptions are primarily omitted.

As illustrated in FIG. 10, the first transistor T1 may be a driving transistor. The first transistor T1 may be connected between a first power supply voltage ELVDD and a second node N2, and may provide a driving current corresponding to a data voltage DATA to the light emitting element OLED. The second transistor T2 may transfer the data voltage DATA received through a data line corresponding to a j-th pixel column to a first node N1 in response to a first gate signal G1 received through a first gate line corresponding to an i-th pixel row. The third transistor T3 may transfer a reference voltage VR to the first node N1 in response to a second gate signal G2 received through a second gate line corresponding to the i-th pixel row. The fourth transistor T4 may transfer an initialization voltage VI to the second node N2 in response to a third gate signal G3 received through a third gate line corresponding to the i-th pixel row.

The fifth transistor T5' may transfer the first power supply voltage ELVDD to the first transistor T1 in response to the fourth gate signal G4. For example, the fifth transistor T5' may include a gate receiving the fourth gate signal G4, a first terminal receiving the first power supply voltage ELVDD, and a second terminal connected to the first terminal of the first transistor T1.

The first capacitor C1 may be connected between the first node N1 and the second node N2. The second capacitor C2 may be connected between the second node N2 and the first power supply voltage ELVDD. The light emitting element OLED may include a first terminal (e.g., an anode) connected to the second node N2 and a second terminal (e.g., a cathode) receiving a second power supply voltage ELVSS.

As illustrated in FIG. 11, one frame period for a pixel PXC may include a first period P1 in which the first node N1 and the second node N2 are initialized, a second period P2 in which a threshold voltage of the first transistor T1 is sensed, a third period P3 in which the data voltage DATA is applied to the first transistor T1, and a fourth period P4 in which the light emitting element OLED emits light based on the data voltage DATA. An operation of the pixel PXC may be substantially the same as an operation of a pixel PXA, except that the fifth transistor T5' is controlled in response to the fourth gate signal G4 that is inverted from the first gate signal G1, and duplicated descriptions are omitted.

Figure 12:
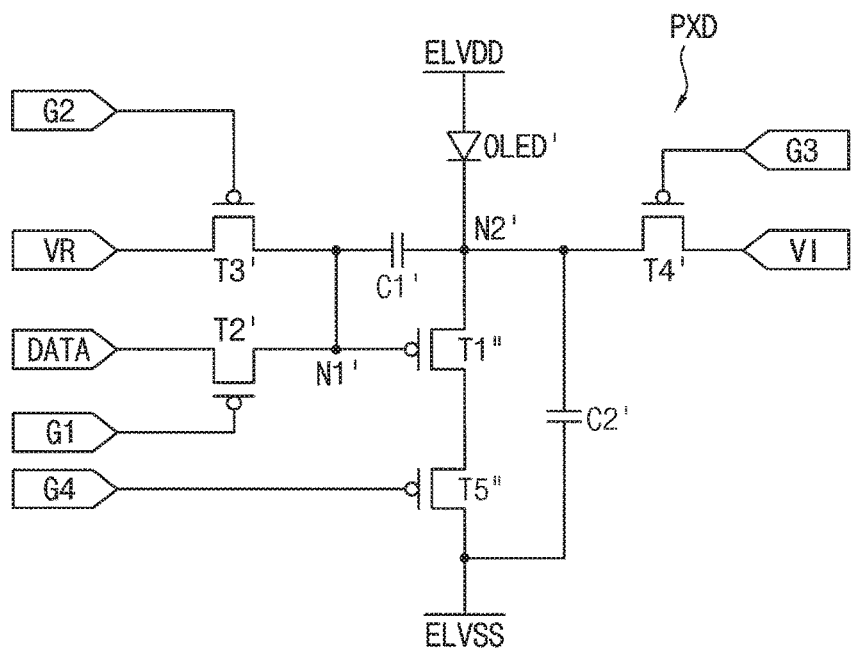
FIG. 12 is a circuit diagram illustrating a pixel included in a display device according to some exemplary embodiments.
Figure 13:
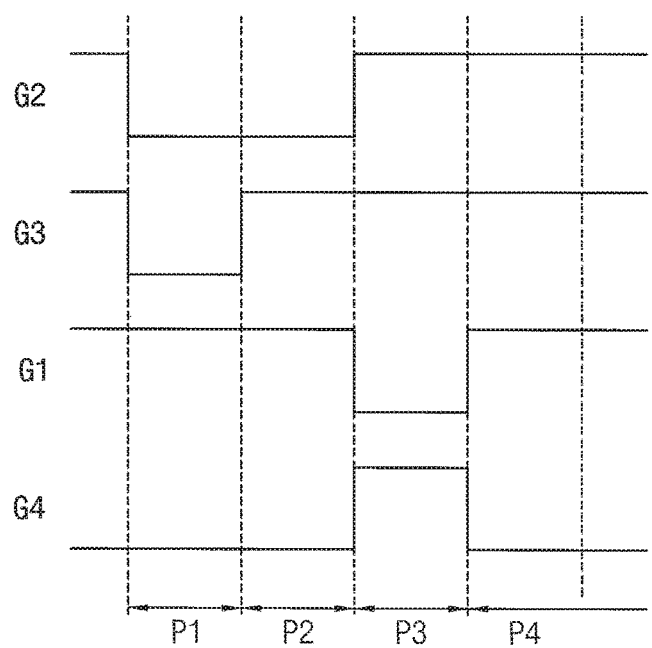
FIG. 13 is a timing diagram for describing exemplary operation of the pixel of FIG. 12 according to some exemplary embodiments.

FIG. 12 is a circuit diagram illustrating a pixel included in a display device according to some exemplary embodiments. FIG. 13 is a timing diagram for describing exemplary operation of the pixel of FIG. 12 according to some exemplary embodiments.

Referring to FIGS. 12 and 13, a pixel PXD may include a first transistor T1", a second transistor T2', a third transistor T3', a fourth transistor T4', a fifth transistor T5", a first capacitor C1', a second capacitor C2', and a light emitting element OLED'. The pixel PXD may be substantially the same as the pixel PXC of FIG. 10, except that the pixel PXD is implemented with p-channel MOS transistors. The same or similar reference numerals may be used to indicate the same or similar elements, and duplicated descriptions are primarily omitted.

As illustrated in FIG. 12, the first transistor T1" may be a driving transistor. The first transistor T1' may be connected between a first power supply voltage ELVSS and a second node N2', and may provide a driving current corresponding to a data voltage DATA to the light emitting element OLED'. The second transistor T2' may transfer the data voltage DATA received through a data line corresponding to a j-th pixel column to a first node N1' in response to a first gate signal G1 received through a first gate line corresponding to an i-th pixel row. The third transistor T3' may transfer a reference voltage VR to the first node N1' in response to a second gate signal G2 received through a second gate line corresponding to the i-th pixel row. The fourth transistor T4' may transfer an initialization voltage VI to the second node N2' in response to a third gate signal G3 received through a third gate line corresponding to the i-th pixel row. The fifth transistor T5" may transfer the first power supply voltage ELVSS to the first transistor T1' in response to a fourth gate signal G4. The first capacitor C1' may be connected between the first node N1' and the second node N2'. The second capacitor C2' may be connected between the second node N2' and the first power supply voltage ELVSS. The light emitting element OLED' may include a first terminal (e.g., an anode) connected to the second node N2' and a second terminal (e.g., a cathode) receiving a second power supply voltage ELVDD.

As illustrated in FIG. 13, one frame period for a pixel PXD may include a first period P1 in which the first node N1' and the second node N2' are initialized, a second period P2 in which a threshold voltage of the first transistor T1" is sensed, a third period P3 in which the data voltage DATA is applied to the first transistor T1", and a fourth period P4 in which the light emitting element OLED' emits light based on the data voltage DATA. An operation of the pixel PXD may be substantially the same as an operation of the pixel PXC of FIG. 10, except that the first through fourth gate signals G1, G2, G3 and G4 are inverted, and duplicated descriptions are omitted.

Unlike the pixel PXC of FIG. 10 and the pixel PXD of FIG. 12, the pixel PXA of FIG. 2 may not receive the fourth gate signal G4. Thus, the number of lines (or gate lines) may be reduced, and a complexity of a gate driver may be reduced. Further, with respect to the pixel PXA of FIG. 2, a fifth transistor receiving a relatively high voltage (or a first power supply voltage ELVDD) may be implemented with a p-channel MOS transistor, second through fourth transistors receiving relatively low voltages may be implemented with n-channel MOS transistors, thereby reducing a voltage range (e.g., from about 0V to about 10V) of gate signals. However, the pixel PXC of FIG. 10 may be implemented with only n-channel MOS transistors, the pixel PXD of FIG. 12 may be implemented with only p-channel MOS transistors, and thus, a process complexity and a manufacturing cost may be reduced compared with the pixel PXA of FIG. 2.

Although some exemplary embodiments of pixel structures have been described, types of transistors of pixels according to exemplary embodiments may not be limited thereto. For example, a second transistor and/or a third transistor of each pixel may be implemented as a dual gate transistor to retain a charge amount of a storage capacitor (or a first capacitor).

The inventive concepts may be applied to any electronic device including a display device. For example, the inventive concepts may be applied to a television (TV), a digital TV, a 3D TV, a smart phone, a mobile phone, a tablet computer, a personal computer (PC), a home appliance, a laptop computer, a personal digital assistant (PDA), a portable multimedia player (PMP), a digital camera, a music player, a portable game console, a navigation device, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concepts. For example, although exemplary embodiments where the display device is an organic light emitting display device are described above, the type of the display device may not be limited thereto.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A pixel comprising:
a first transistor comprising a gate connected to a first node, a first terminal, and a second terminal connected to a second node;
a second transistor comprising a gate configured to receive a first gate signal, a first terminal configured to receive a data voltage, and a second terminal connected to the first node;
a third transistor comprising a gate configured to receive a second gate signal, a first terminal configured to receive a reference voltage, and a second terminal connected to the first node;
a fourth transistor comprising a gate configured to receive a third gate signal, a first terminal configured to receive an initialization voltage, and a second terminal connected to the second node;
a fifth transistor comprising a gate configured to receive the first gate signal, a first terminal configured to receive a first power supply voltage, and a second terminal connected to the first terminal of the first transistor;
a first capacitor comprising a first electrode connected to the first node, and a second electrode connected to the second node;
a second capacitor comprising a first electrode connected to the second node, and a second electrode configured to receive the first power supply voltage; and
a light emitting element comprising a first terminal connected to the second node, and a second terminal configured to receive a second power supply voltage.

2. The pixel of claim 1, wherein:
the second transistor is configured to turn on in response to a first logic level of the first gate signal; and
the fifth transistor is configured to turn on in response to a second logic level of the first gate signal, the second logic level being different from the first logic level.

3. The pixel of claim 2, wherein:
the second transistor is an n-channel metal oxide semiconductor (MOS) transistor; and
the fifth transistor is a p-channel MOS transistor.

4. The pixel of claim 3, wherein the third transistor and the fourth transistor are n-channel MOS transistors.

5. The pixel of claim 4, wherein the first power supply voltage is greater than the reference voltage, the initialization voltage, and the data voltage.

6. The pixel of claim 1, wherein:
the second transistor is configured to receive the data voltage through a data line; and
the third transistor is configured to receive the reference voltage through a reference voltage line different from the data line.

7. The pixel of claim 1, wherein the reference voltage is greater than the initialization voltage.

8. The pixel of claim 1, wherein the first transistor further comprises a second gate connected to the second node.

9. The pixel of claim 1, wherein the first transistor is an n-channel MOS transistor.

10. A display device comprising:
a display panel comprising a plurality of pixels; and
a panel driver configured to drive the display panel,
wherein at least one pixel among the pixels comprises:
a first transistor comprising a gate connected to a first node, a first terminal, and a second terminal connected to a second node;
a second transistor comprising a gate configured to receive a first gate signal, a first terminal configured to receive a data voltage, and a second terminal connected to the first node;
a third transistor comprising a gate configured to receive a second gate signal, a first terminal configured to receive a reference voltage, and a second terminal connected to the first node;
a fourth transistor comprising a gate configured to receive a third gate signal, a first terminal configured to receive an initialization voltage, and a second terminal connected to the second node;
a fifth transistor comprising a gate configured to receive the first gate signal, a first terminal configured to receive a first power supply voltage, and a second terminal connected to the first terminal of the first transistor;
a first capacitor comprising a first electrode connected to the first node, and a second electrode connected to the second node;
a second capacitor comprising a first electrode connected to the second node, and a second electrode configured to receive the first power supply voltage; and
a light emitting element comprising a first terminal connected to the second node, and a second terminal configured to receive a second power supply voltage.

11. The display device of claim 10, wherein a frame period of the display device comprises:
a first period in which the first node and the second node are initialized;
a second period in which a threshold voltage of the first transistor is sensed;
a third period in which the data voltage is applied to the first transistor; and
a fourth period in which the light emitting element emits light based on the data voltage.

12. The display device of claim 11, wherein a length of the second period is longer than one horizontal period.

13. The display device of claim 11, wherein a length of the third period is one horizontal period.

14. The display device of claim 11, wherein, in the first period:
the third transistor, the fourth transistor, and the fifth transistor are configured to be turned on; and
the second transistor is configured to be turned off.

15. The display device of claim 11, wherein, in the second period:
the third transistor and the fifth transistor are configured to be turned on; and
the second transistor and the fourth transistor are configured to be turned off.

16. The display device of claim 11, wherein, in the third period:
the second transistor is configured to be turned on; and
the third transistor, the fourth transistor and the fifth transistor are configured to be turned off.

17. The display device of claim 11, wherein, in the fourth period:
the fifth transistor is configured to be turned on; and
the second transistor, the third transistor, and the fourth transistor are configured to be turned off.

18. The display device of claim 11, wherein:
the second transistor is an n-channel metal oxide semiconductor (MOS) transistor; and
the fifth transistor is a p-channel MOS transistor.

19. The display device of claim 11, wherein:
the second transistor is configured to receive the data voltage through a data line; and the third transistor is configured to receive the reference voltage through a reference voltage line different from the data line.

20. The display device of claim 11, wherein the first transistor further comprises a second gate connected to the second node.

21. A pixel comprising:
a first transistor comprising a gate connected to a first node, a first terminal, and a second terminal connected to a second node;
a second transistor comprising a gate configured to receive a first gate signal, a first terminal configured to receive a data voltage, and a second terminal connected to the first node;
a third transistor comprising a gate configured to receive a second gate signal, a first terminal configured to receive a reference voltage, and a second terminal connected to the first node;
a fourth transistor comprising a gate configured to receive a third gate signal, a first terminal configured to receive an initialization voltage, and a second terminal connected to the second node;
a fifth transistor comprising a gate configured to receive a fourth gate signal, a first terminal configured to receive a first power supply voltage, and a second terminal connected to the first terminal of the first transistor;
a first capacitor comprising a first electrode connected to the first node, and a second electrode connected to the second node;
a second capacitor comprising a first electrode connected to the second node, and a second electrode configured to receive the first power supply voltage; and
a light emitting element comprising a first terminal connected to the second node, and a second terminal configured to receive a second power supply voltage.

* * * * *